United States Patent

Ryu et al.

[11] Patent Number: 6,166,988
[45] Date of Patent: Dec. 26, 2000

[54] SEMICONDUCTOR MEMORY DEVICE USING ONE COMMON ADDRESS BUS LINE BETWEEN ADDRESS BUFFERS AND COLUMN PREDECODER

[75] Inventors: Je-Hun Ryu; Jong-Hee Han, both of Ichon-shi, Rep. of Korea

[73] Assignee: Hyundai Electronics Industries Co., Ltd., Ichon-shi, Rep. of Korea

[21] Appl. No.: 09/471,109

[22] Filed: Dec. 23, 1999

[30] Foreign Application Priority Data

Dec. 24, 1998 [KR] Rep. of Korea ............. 98-58577

[51] Int. Cl.[7] ........................................ G11C 8/00

[52] U.S. Cl. ............... 365/230.08; 365/194; 365/230.06

[58] Field of Search .................... 365/230.08, 194, 365/233, 230.06

[56] References Cited

U.S. PATENT DOCUMENTS 5,818,770 10/1998 Kim et al. ........................ 365/194
6,018,485 1/2000 Cha et al. ........................ 365/194

Primary Examiner—Son T. Dinh
Attorney, Agent, or Firm—Jacobson, Price, Holman & Stern, PLLC

[57] ABSTRACT

A semiconductor memory device, includes: an external address buffer for buffering a first address signal to generate a buffered address signal; a delay for delaying the buffered address signal for a predetermined time to generate a delayed address signal; an internal address buffer for buffering the buffered address signal and the delayed address signal to generate a second address signal; a common address bus line; a switching unit responsive to a control signal for selectively coupling one of the buffered address signal, the delayed address signal and the second address signal as a selected address signal to said common address bus line; and a column predecoder for predecoding the selected address signal transferred via said common address bus line.

13 Claims, 5 Drawing Sheets

SEMICONDUCTOR MEMORY DEVICE USING ONE COMMON ADDRESS BUS LINE BETWEEN ADDRESS BUFFERS AND COLUMN PREDECODER

FIELD OF THE INVENTION

The present invention relates to a semiconductor memory device; and, more particularly, to a semiconductor memory device using one common address bus line between address buffers and a column predecoder.

DESCRIPTION OF THE PRIOR ART

Referring to FIG. 1, there is shown a block diagram illustrative of decoding address signals for the sake of selecting a bit line in a conventional semiconductor memory device. In order to select the bit line, the conventional semiconductor memory device includes an external address buffer block 11, an internal address buffer block 12, a column predecoder 13, a column decoder 14 and a memory array block 15.

The conventional semiconductor memory device selects the bit line with external column address signals and internal column address signals to carry out a read and write operation in a memory cell of the memory array block 15. As shown, the external address buffer block 11 has N+1 numbers of external address buffers 111 for address signals $A_0$ to $A_N$, wherein N is a positive integer. An external address buffer 111 contained in the external address buffer block 11 is coupled to two complementary external address bus lines, which are loaded with address signals ADD and ADDB, respectively. The N+1 numbers of external address buffers 111 contained in the external address buffer block 11 are coupled to the column predecoder 3 via 2(N+1) numbers of external address bus lines.

The internal address buffer block 12 has N+1 numbers of internal address buffers (not shown). An internal address buffer contained in the internal address buffer block 12 is coupled to two complementary internal address bus lines, which are loaded with address signals INT_ADD and INT_ADDB, respectively. The N+1 numbers of internal address buffers contained in the internal address buffer block 12 are coupled to the column predecoder 13 via 2(N+1) numbers of internal address bus lines. Accordingly, 4(N+1) numbers of internal and external address bus lines are coupled between the external and internal address buffer blocks 11 and 12 and the column predecoder 13.

Referring to FIG. 2, there is shown a block diagram illustrative of decoding address signals for the sake of selecting a bit line in a conventional double data rate (DDR) synchronous dynamic random access memory (SDRAM).

The conventional DDR SDRAM includes a delay block 26 as well as the internal and external address buffer blocks 11 and 12 as described in connection with FIG. 1.

The delay block 26 has N+1 numbers of delays (not shown). A delay contained in the delay block 26 is coupled to two complementary address bus lines, which are loaded with address signals $2CLK_{DLY\_}ADD$ and $2CLK_{DLY\_}ADDB$, respectively. The N+1 numbers of delays contained in the delay block 26 have 2(N+1) numbers of two-clock delayed address bus lines. After a write command is issued in the DDR SDRAM, the DDR SDRAM needs two-clock delayed address bus lines in order to perform a write operation. The DDR SDRAM needs 6(N+1) numbers of address bus lines including the 2(N+1) numbers of internal address bus lines, the 2(N+1) numbers of external address bus lines and the 2(N+1) numbers of two-clock delayed address bus lines.

Accordingly, it is strongly needed that a semiconductor memory device capable of increasing integration density by reducing the number of address bus lines.

SUMMARY OF THE INVENTION

It is, therefore, an object of the present invention to provide a semiconductor memory device using one common address bus line between address buffers and a column predecoder that is capable of increasing integration density by reducing the number of address bus lines.

In accordance with an aspect of the present invention, there is provided a semiconductor memory device, comprising: a first address buffer for buffering a first address signal to generate a buffered address signal; a delay means for delaying the buffered address signal for a predetermined time to generate a delayed address signal; a second address buffer for buffering the buffered address signal and the delayed address signal to generate a second address signal; a common address bus line; a switching means responsive to a control signal for selectively coupling one of the buffered address signal, the delayed address signal and the second address signal as a selected address signal to said common address bus line; and a predecoding means for predecoding the selected address signal transferred via said common address bus line.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Figure 3:
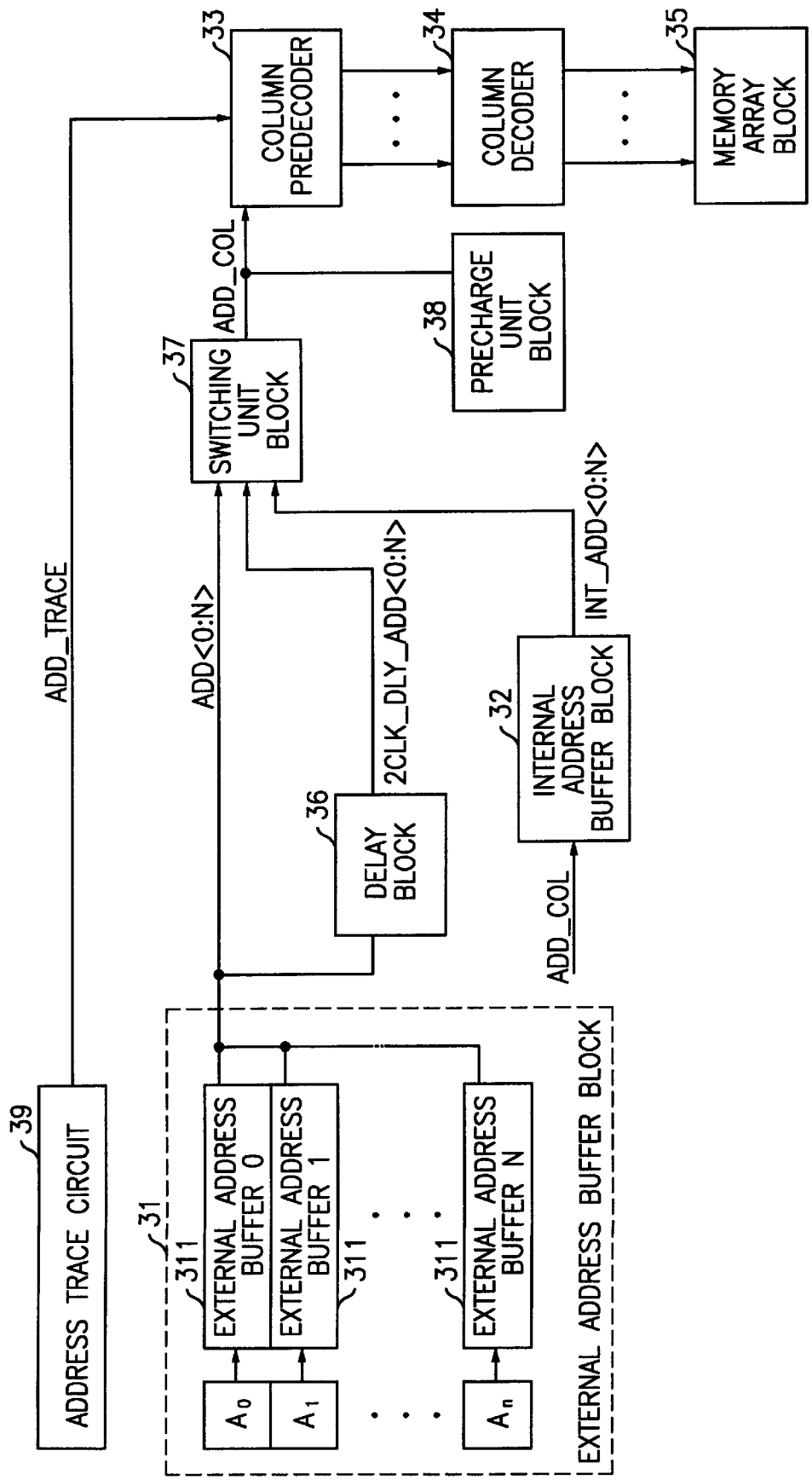
FIG. 3 is a block diagram illustrative of decoding address signals for the sake of selecting a bit line in a DDR SDRAM in accordance with the present invention.

Referring to FIG. 3, there is shown a block diagram illustrative of decoding address signals for the sake of selecting a bit line in a DDR SDRAM in accordance with the present invention.

The DDR SDRAM includes an external address buffer block 31, an internal address buffer block 32, a column predecoder 33, a column decoder 34, a memory array block 35, a delay block 36, a switching unit block 37, a precharge unit block 38 and an address trace circuit 39.

As shown, the external address buffer block 31 has N+1 numbers of external address buffers 311 (not shown) for address signals $A_0$ to $A_N$. When a read command is issued, an external address buffer 311 contained in the external address buffer block 31 is coupled to a common address bus line via the switching unit block 37. At this time, the common address bus line is loaded with a buffered address signal ADD buffered by the external address buffer 311, wherein the common address bus line is coupled between the switching unit block 37 and the column predecoder 33. The N+1 numbers of external address buffers 311 contained in the external address buffer block 31 are coupled to N+1 numbers of common address bus lines via the switching unit block 37, wherein N is a positive integer.

Further, the delay block 36 has N+1 numbers of delays (not shown). when a write command is issued, a delay contained in the delay block 36 is coupled to a common address bus line via the switching unit block 37. At this time, the common address bus line is loaded with a two-clock delayed address signal 2CLK_DLY_ADD delayed for a two-clock time by the delay. The N+1 numbers of delays contained in the delay block 36 are coupled to the N+1 numbers of common address bus lines via the switching unit block 37.

Furthermore, the internal address buffer block 32 has the N+1 numbers of internal address buffers (not shown) to generate an internal address signal INT_ADD. When a burst read and write command is issued, an internal address buffer contained in the internal address buffer block 32 is coupled to a common address bus line via the switching unit block 37. At this time, the common address line is loaded with the internal address signal INT_ADD generated by the internal address buffer. The N+1 numbers of internal address buffers contained in the internal address buffer block 32 are coupled to the N+1 numbers of common address bus lines via the switching unit block 37.

The switching unit block 37 coupled to the N+1 numbers of common address bus lines selectively switches the buffered address signals ADD, the two-clock delayed address signals 2CLK_DLY_ADD and the internal address signals INT_ADD in response to the read command, the write command, and the burst read and write command. The switching unit block 37 includes N+1 numbers of switching units (not shown).

The precharge unit block 38 precharges the N+1 numbers of common address bus lines, wherein the precharge unit block 38 includes N+1 numbers of precharge units (not shown). The address trace circuit 39 generates an address trace signal ADD_TRACE to inform the column predecoder 33 that address information from all address buffers has reached the column predecoder 33.

Figure 1:
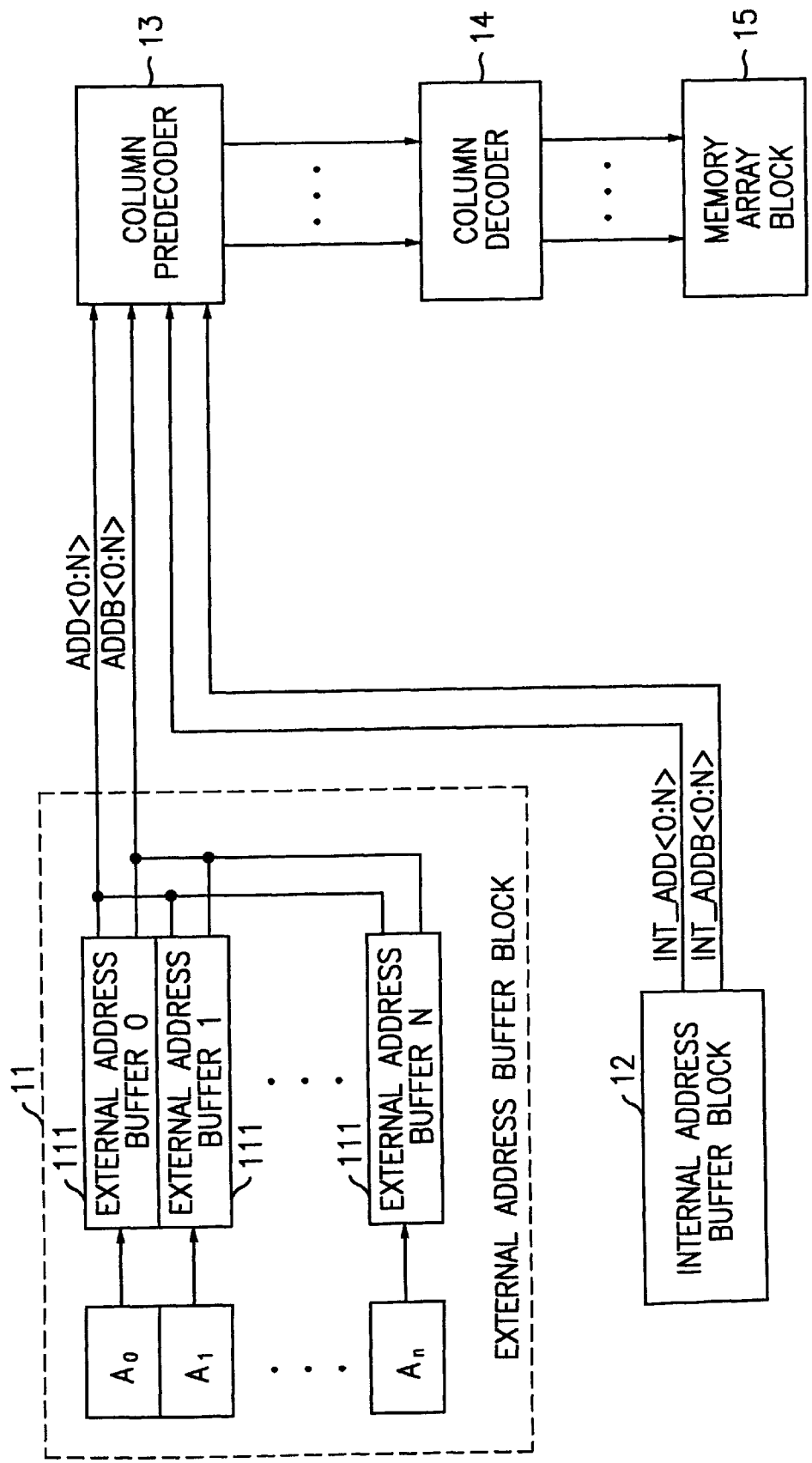
FIG. 1 is a block diagram illustrative of decoding address signals for the sake of selecting a bit line in a conventional semiconductor memory device.
Figure 2:
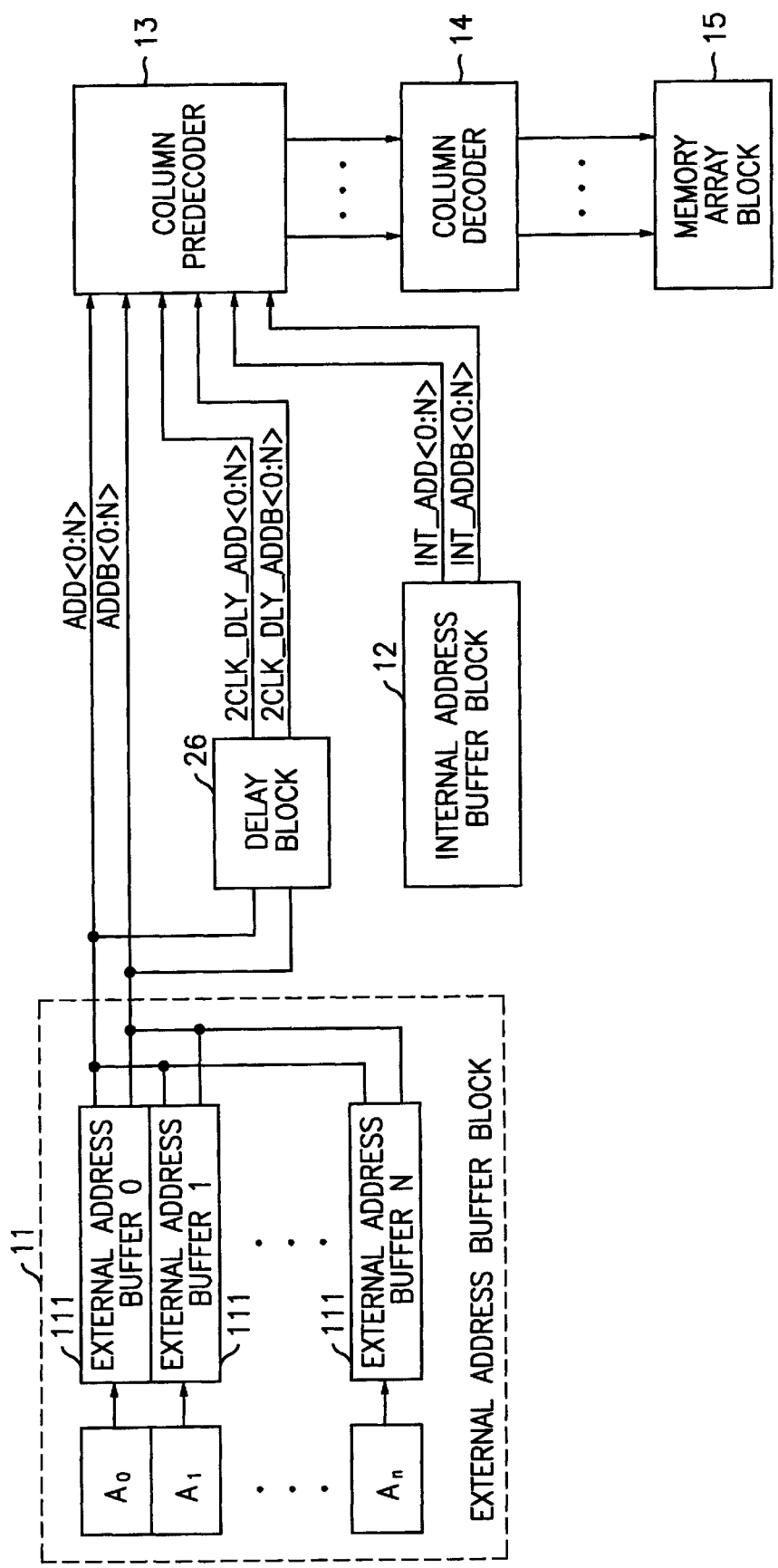
FIG. 2 is a block diagram illustrative of decoding address signals for the sake of selecting a bit line in a conventional DDR SDRAM.

Accordingly, the DDR SDRAM selectively transmits external address information, two-clock delayed address information and internal address information to a column predecoder 33 via the N+1 numbers of common address bus lines. The number of address bus lines shown in FIG. 3 decreases up to 17% as compared with the number of address bus lines shown in FIG. 2.

Figure 4:
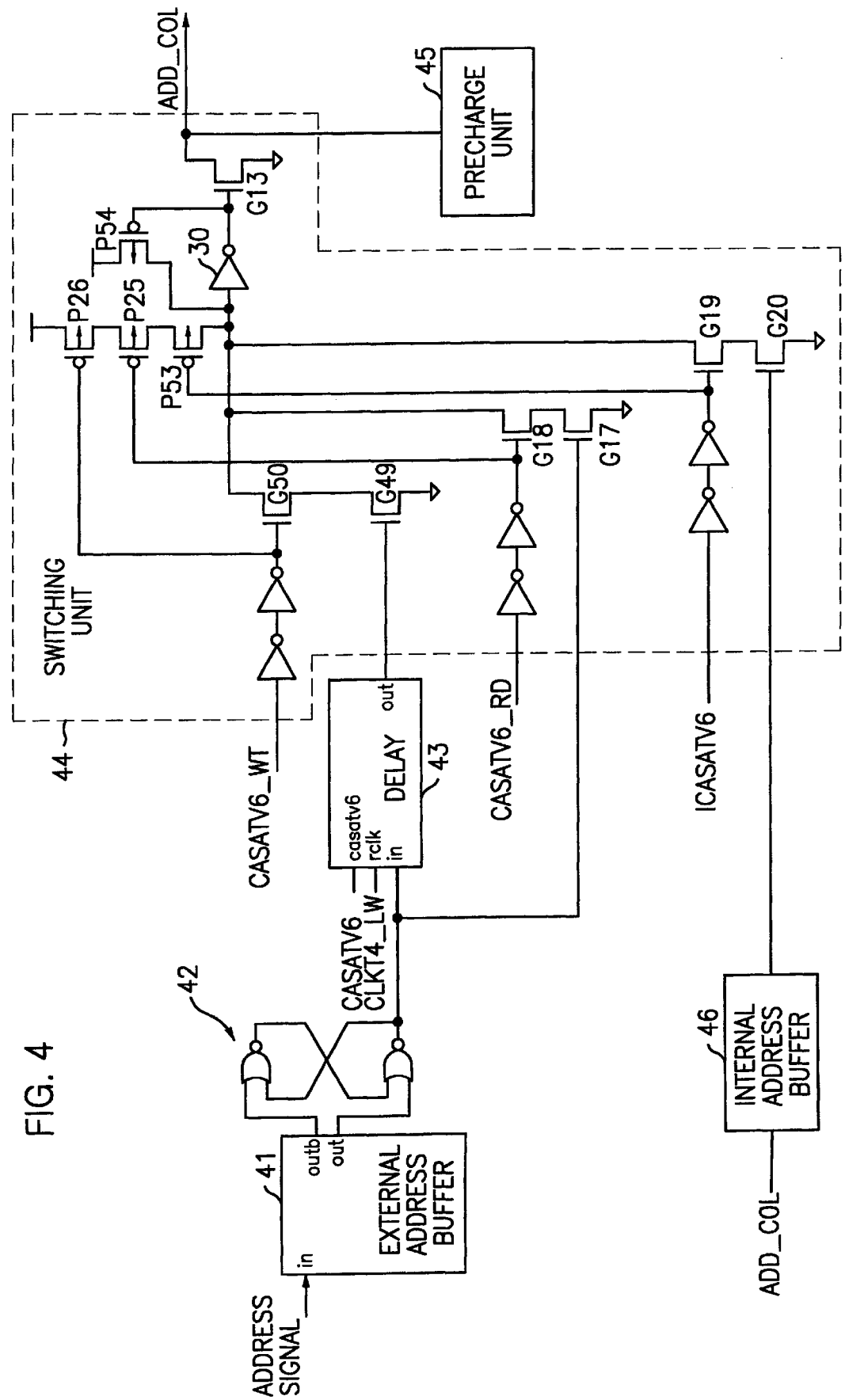
FIG. 4 is a schematic diagram depicting an address buffer circuit contained in a DDR SDRAM in accordance with the present invention.

Referring to FIG. 4, there is shown a schematic diagram depicting an address buffer circuit contained in a DDR SDRAM in accordance with the present invention. When a read command is issued and the address buffer circuit receives an address signal from an external circuit (not shown), the address buffer circuit loads the address signal from the external circuit on a common address bus line in response to a read control signal CASATV6_RD. In other words, the address buffer circuit outputs an output signal ADD_COL as the address signal to the common address bus line in response to the read control signal CASATV6_RD. An external address buffer 41 buffers the address signal from the external circuit and a latch 42 latches the address signal buffered by the external address buffer 41.

For example, when the read command is issued and the external address buffer 41 receives the address signal from the external circuit, the read control signal CASATV6_RD is high and an NMOS transistor G18 is turned on. At this time, a write control signal CASATV6_WT and a burst control signal ICASATV6 are low and also NMOS transistors G50 and G19 are turned off. When the NMOS transistor G18 is turned on in response to the read control signal CASATV6_RD and an NMOS transistor G17 is turned on in response to the address signal latched by the latch 42, the NMOS transistor G13 outputs the low level signal as the output signal ADD_COL. When a gate terminal of the NMOS transistor G17 receives a high level signal, the NMOS transistor G17 is turned on. The NMOS transistor G13 outputs a high level signal as the output signal ADD_COL until a gate terminal of an NMOS transistor G17, G20 or G49 receives a high level signal.

Further, when a write command is issued and a delay 43 delays the buffered address signal for a two-clock time, the write control signal CASATV6_WT is high and the NMOS transistor G50 is turned on. The delay 43 receives the buffered address signal, an active signal CASATV6 and a clock signal CLKT_4. At this time, the read control signals CASATV6_RD and the burst control signal ICASATV6 are low and the NMOS transistors G18 and G19 are turned off. When the NMOS transistor G50 is turned on in response to the write control signal CASATV6_WT and the NMOS transistor G49 is turned on in response to the delayed address signal, the NMOS transistor G13 outputs the low level signal as the output signal ADD_COL. When a gate terminal of the NMOS transistor G49 receives a high level signal, the NMOS transistor G49 is turned on.

Furthermore, when a burst read and write command is issued and the internal address buffer 46 receives the buffered address signal or the delayed address signal as the output signal ADD_COL to generate an internal address signal, the burst control signal ICASATV6 is high and the NMOS transistor G19 is turned on.

At this time, the write control signal CASATV6_WT and the read control signal CASATV6_RD are low and NMOS transistors G50 and G18 are turned off. When the NMOS transistors G19 is turned on in response to the burst control signal ICASATV6 and an NMOS transistor G20 is turned on in response to the internal address signal, the NMOS transistor G13 outputs the low level signal as the output signal ADD_COL. When the gate terminal of the NMOS transistor G20 receives a high level signal, the NMOS transistor G20 is turned on.

A precharge unit 45 is coupled to a terminal of the NMOS transistor G13. After the NMOS transistor G13 outputs the output signal ADD_COL, the precharge unit 45 precharges the terminal of the NMOS transistor G13. PMOS transistors P25, P26 and P53 apply power supply voltage to an input terminal of the inverter 30. A source terminal of the PMOS transistor P54 is coupled to power supply. A gate terminal of the PMOS transistor P54 is coupled to an output terminal of the invertor 30. A drain terminal of the PMOS transistor P54 is coupled to the input terminal of the inverter 30.

Figure 5:
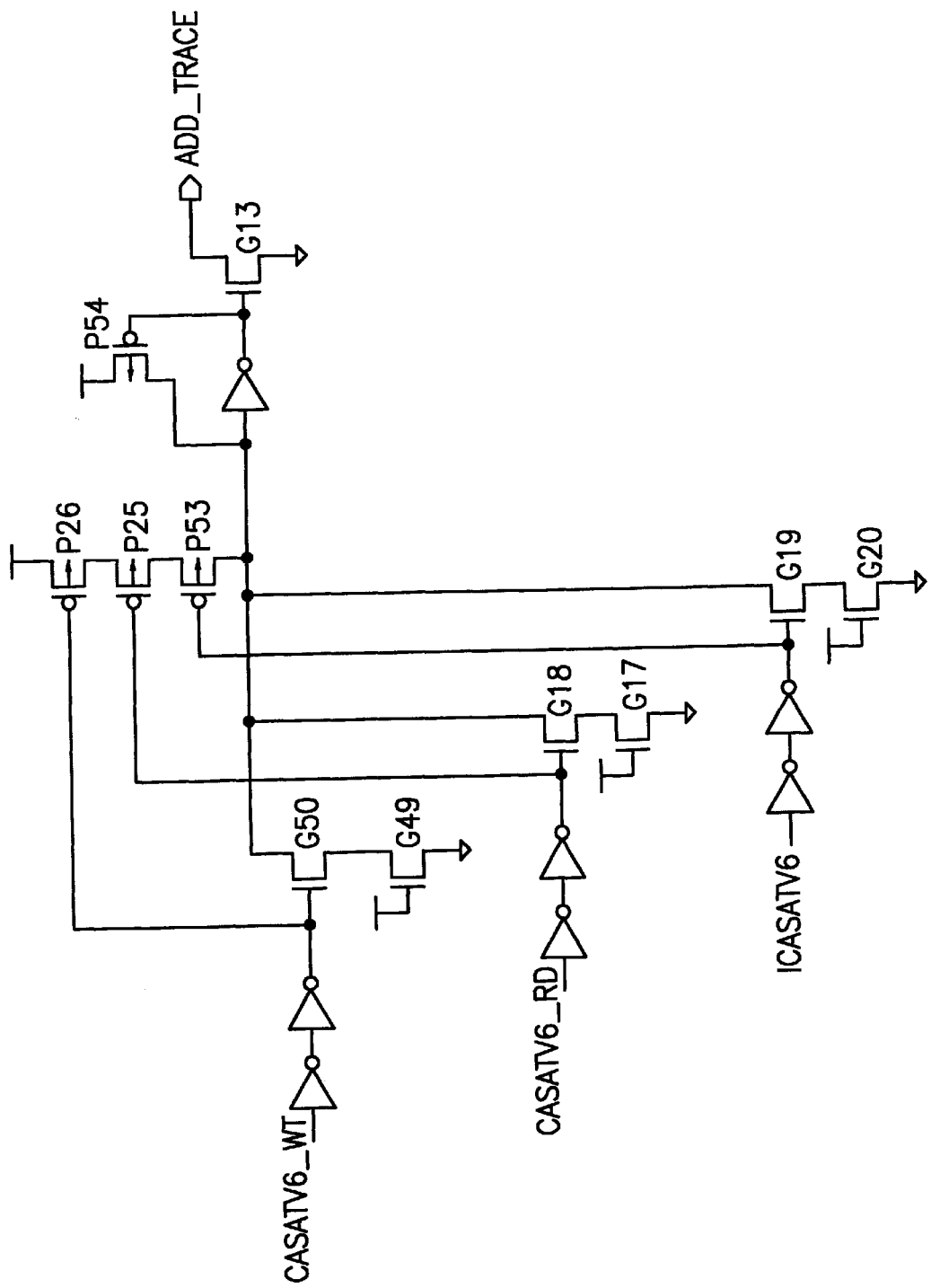
FIG. 5 is a circuit diagram describing an address trace circuit coupled to a column predecoder shown in FIG. 3.

Referring to FIG. 5, there is shown a circuit diagram describing an address trace circuit 39 coupled to the column predecoder 33 shown in FIG. 3.

The address trace circuit generates an address trace signal ADD_TRACE to inform the column predecoder 33 that address information from all address buffers has reached the column predecoder 33. NMOS transistors G17, G20 and G49 shown in FIG. 5 are in a turn-on state. When one of a write control signal CASATV6_WT, a read control signal CASATV6_RD and a burst control signal ICASATV6 is active, the address trace circuit outputs a low level signal as the address trace signal ADD_TRACE to the column predecoder 33 shown in FIG. 3.

The address trace circuit is adjacent to an outmost address buffer among the address buffers. Further, the address trace circuit is the same as a circuit where the external address buffer 41, the latch 42, the delay 43, the precharge unit 45 and the internal address buffer 46 are separated from the address buffer circuit as shown in FIG. 4. The address trace circuit may be replaced with other circuit.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device, comprising:
    a first address buffer for buffering a first address signal to generate a buffered address signal;
    a delay means for delaying the buffered address signal for a predetermined time to generate a delayed address signal;
    a second address buffer for buffering the buffered address signal or the delayed address signal as a selected address signal to generate a second address signal;
    a common address bus line;
    a switching means responsive to a control signal for selectively coupling one of the buffered address signal, the delayed address signal and the second address signal as the selected address signal to said common address bus line; and
    a predecoding means for predecoding the selected address signal transferred via said common address bus line.

2. The semiconductor memory device as recited in claim 1, wherein the control signal includes a read control signal, a write control signal and a burst control signal.

3. The semiconductor memory device as recited in claim 2, wherein said switching means includes:
    a first switching means for switching the buffered address signal in response to the read control signal;
    a second switching means for switching the delayed address signal in response to the write control signal; and
    a third switching means for switching the second address signal in response to the burst control signal.

4. The semiconductor memory device as recited in claim 3, wherein said first switching means includes:
    a first transistor coupled to said first address buffer, wherein said first transistor is turned on in response to the buffered address signal; and
    a second transistor coupled to said first transistor, wherein said second transistor is turned on in response to the read control signal.

5. The semiconductor memory device as recited in claim 3, wherein said second switching means includes:
    a first transistor coupled to said delay means, wherein said first transistor is turned on in response to the delayed address signal; and
    a second transistor coupled to said first transistor, wherein said second transistor is turned on in response to the write control signal.

6. The semiconductor memory device as recited in claim 3, wherein said third switching means includes:
    a first transistor coupled to said second address buffer, wherein said first transistor is turned on in response to the second address signal; and
    a second transistor coupled to said first transistor, wherein said second transistor is turned on in response to the burst control signal.

7. The semiconductor memory device as recited in claim 1, said switching means further includes:
    a precharge means for precharging said common address bus line.

8. The semiconductor memory device as recited in claim 2, further comprising:
    a signal generating means for generating an address trace signal to be coupled to said predecoding means, wherein the address trace signal represents information associated with the first address signal.

9. The semiconductor memory device as recited in claim 8, the address trace signal includes a first address trace signal, a second address trace signal and a third address trace signal.

10. The semiconductor memory device as recited in claim 9, wherein said signal generating means includes:
    a first signal generating means for generating the first address trace signal in response to the read control signal;
    a second signal generating means for generating the second address trace signal in response to the write control signal; and
    a third signal generating means for generating the third address trace signal in response to the burst control signal.

11. The semiconductor memory device as recited in claim 10, wherein said first signal generating means includes:
    a first transistor being in a turn-on state; and
    a second transistor coupled to said first transistor, wherein said second transistor is turned on in response to the read control signal.

12. The semiconductor memory device as recited in claim 10, wherein said second signal generating means includes:
    a first transistor being in a turn-on state; and
    a second transistor coupled to said first transistor, wherein said second transistor is turned on in response to the write control signal.

13. The semiconductor memory device as recited in claim 10, wherein said third signal generating means includes:
    a first transistor being in a turn-on state; and
    a second transistor coupled to said first transistor, wherein said second transistor is turned on in response to the burst control signal.

* * * * *